US008633534B2

(12) United States Patent
Haverty et al.

(10) Patent No.: US 8,633,534 B2
(45) Date of Patent: Jan. 21, 2014

(54) TRANSISTOR CHANNEL MOBILITY USING ALTERNATE GATE DIELECTRIC MATERIALS

(75) Inventors: Michael G. Haverty, Mountain View, CA (US); Sadasivan Shankar, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 345 days.

(21) Appl. No.: 12/976,385

(22) Filed: Dec. 22, 2010

(65) Prior Publication Data

US 2012/0161251 A1    Jun. 28, 2012

(51) Int. Cl.
*H01L 29/792*    (2006.01)
*H01L 21/336*    (2006.01)

(52) U.S. Cl.
USPC ........... 257/324; 257/374; 257/510; 438/261; 438/287; 438/785

(58) Field of Classification Search
USPC ................. 257/288, 324, 330, 374, 510, 513; 438/259, 261, 287, 424, 785
See application file for complete search history.

(56) References Cited

U.S. PATENT DOCUMENTS 8,084,824 B2 * 12/2011 Yu et al. .................... 257/369
8,193,050 B2 *  6/2012 Yu et al. .................... 438/199
2005/0067651 A1 *  3/2005 Kim et al. .................. 257/314
2005/0156171 A1     7/2005 Brask et al.
2007/0082492 A1 *  4/2007 Kim et al. .................. 438/694
2007/0262451 A1    11/2007 Rachmady et al.
2008/0217681 A1 *  9/2008 Choi et al. .................. 257/324
2008/0245658 A1    10/2008 Callegari et al.
2010/0059801 A1 *  3/2010 Kamei et al. ............... 257/288
2010/0060260 A1 *  3/2010 Krauss et al. ................ 324/92
2011/0215404 A1 *  9/2011 Zhu et al. .................... 257/336

FOREIGN PATENT DOCUMENTS

JP        2000-106428 A      4/2000

OTHER PUBLICATIONS

PCT/US2011/064443 Written Opinion of the International Searching Authority issued Dec. 12, 2011, 10 pages.

* cited by examiner

*Primary Examiner* — Hsien Ming Lee
(74) *Attorney, Agent, or Firm* — Blakely, Sokoloff, Taylor & Zafman LLP

(57) ABSTRACT

An apparatus comprises a substrate, a phonon-decoupling layer formed on the substrate, a gate dielectric layer formed on the phonon-decoupling layer, a gate electrode formed on the gate dielectric layer, a pair of spacers formed on opposite sides of the gate electrode, a source region formed in the substrate subjacent to the phonon-decoupling layer, and a drain region formed in the substrate subjacent to the phonon-decoupling layer. The phonon-decoupling layer prevents the formation of a silicon dioxide interfacial layer and reduces coupling between high-k phonons and the field in the substrate.

19 Claims, 5 Drawing Sheets

TRANSISTOR CHANNEL MOBILITY USING ALTERNATE GATE DIELECTRIC MATERIALS

BACKGROUND

In the art of metal-oxide-semiconductor field-effect transistors (MOSFET) built on semiconductor substrates, there is a constant push to improve the MOSFET performance and efficiency. This process includes scaling down the size of these MOSFET devices. As MOSFET devices are scaled to smaller dimensions, the silicon dioxide gate dielectric layers that are conventionally used in these devices become too thin and have to be replaced by high-k gate dielectric materials. Unfortunately, there are some drawbacks to the use of high-k dielectric materials. For example, after a high-k dielectric material is deposited on the semiconductor substrate, subsequent thermal processing unintentionally causes an interfacial layer to form at the interface between the high-k gate dielectric layer and the substrate. This is because the thermal processing causes oxygen in the high-k material to react with silicon in the substrate, thereby forming the interfacial silicon dioxide layer. This silicon interfacial layer has a low dielectric constant that adversely impacts the effective dielectric constant of the gate dielectric stack.

Another issue with the use of high-k dielectric materials is that phonons in the high-k dielectric material tend to couple with the field of electrons in the channel region of the MOSFET device. This coupling between the high-k phonons and the field of electrons degrades device mobility. Accordingly, improvements to the gate dielectric layer are needed to enable further scaling of MOSFET devices.

DETAILED DESCRIPTION

Described herein are systems and methods of improving the channel mobility of a field-effect transistor. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
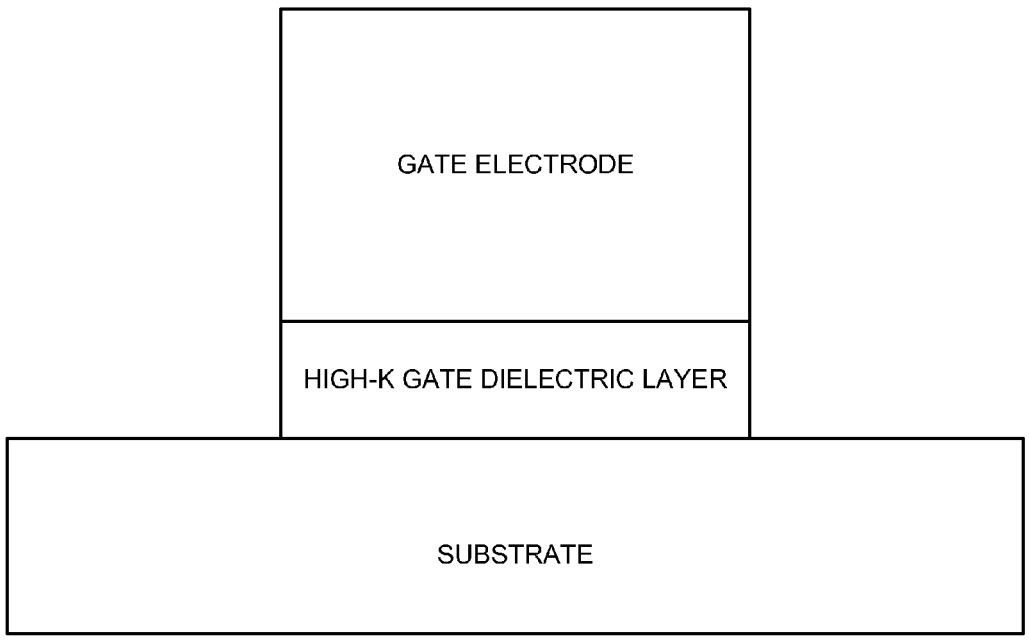
FIGS. 1A and 1B illustrate a conventional gate dielectric layer and gate electrode layer where an interfacial layer is formed.

By way of background, FIG. 1A illustrates a conventional process where a high-k gate dielectric material is deposited on a substrate. A gate electrode is formed atop the high-k gate dielectric material. The structure shown in FIG. 1A is prior to any thermal processing that will take place as the remainder of the transistor and its associated components are fabricated. The structure of FIG. 1A is therefore thermodynamically unstable, as it will not remain in this form once it is subjected to thermal processing.

Figure 1B:
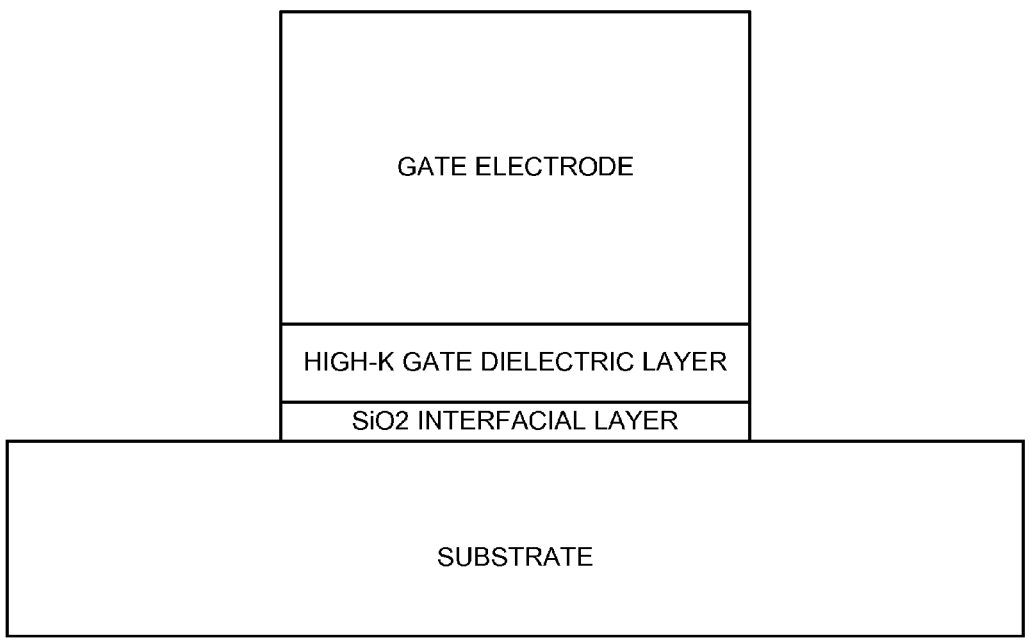

FIG. 1B illustrates the structure shown in FIG. 1A after it has been subjected to thermal processing. Again, the thermal processing may be used to form the remainder of the transistor and its associated components, but nevertheless, the high-k gate dielectric layer will be subjected to this processing. As shown in FIG. 1B, an interfacial dielectric layer has formed at the interface between the high-k material and the substrate. This interfacial layer is a silicon dioxide layer that forms when oxygen in the high-k dielectric material reacts with silicon in the substrate. The silicon dioxide-based interfacial layer has a low dielectric constant that adversely impacts the effective dielectric constant of the gate dielectric layer.

Figure 2A:
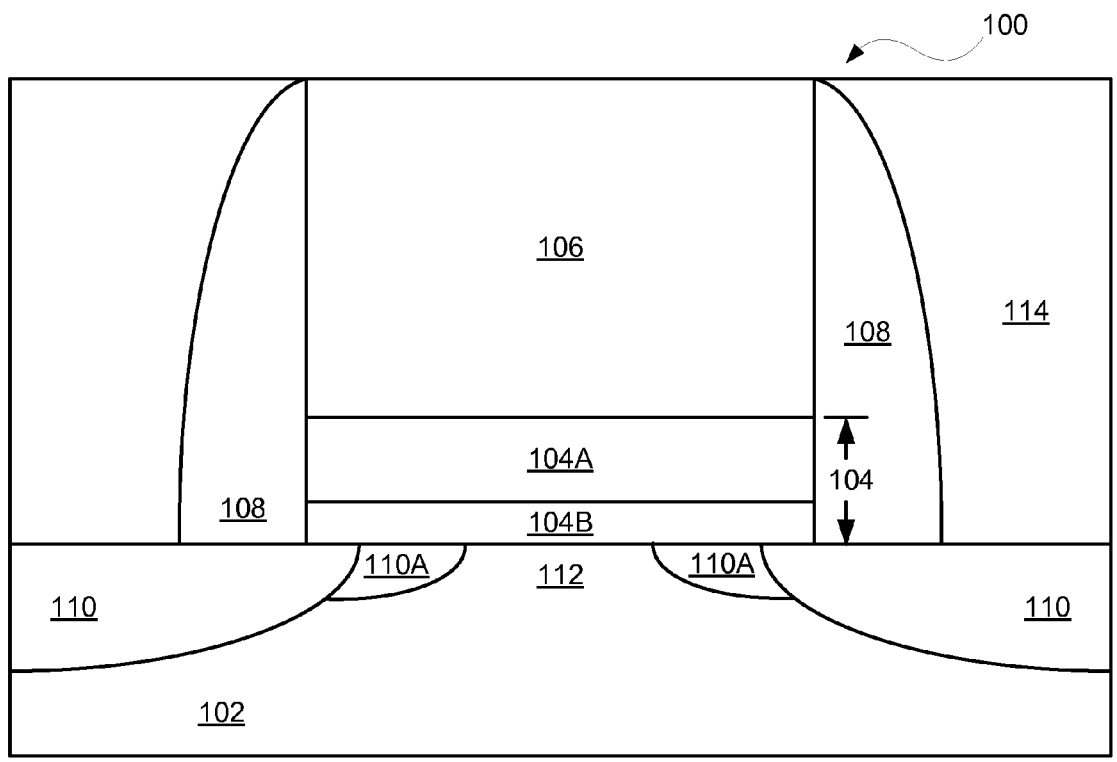
FIGS. 2A and 2B illustrate implementations of the invention where a phonon-decoupling layer is included in the gate dielectric stack of a transistor.
Figure 2B:
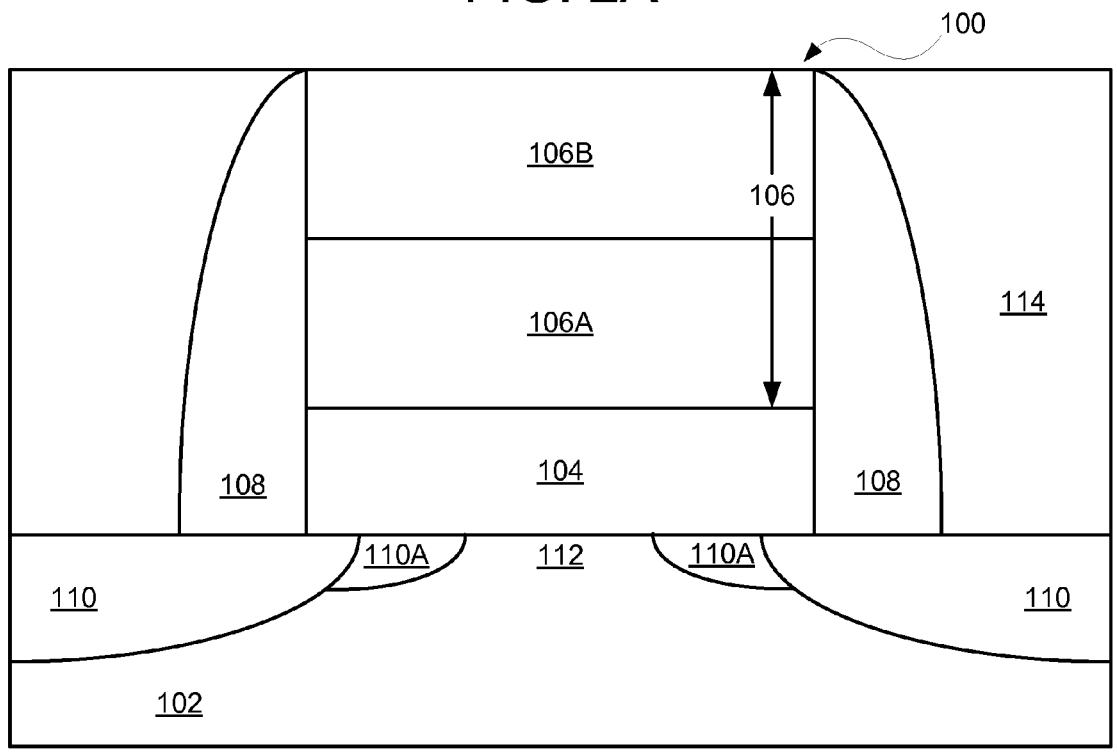

FIGS. 2A and 2B illustrate a transistor 100 formed in accordance with implementations of the invention that can reduce or eliminate the presence of the silicon dioxide interfacial layer and that can reduce coupling between high-k phonons and the field in the channel region of the transistor. The transistor 100 is formed on a semiconductor substrate 102. The semiconductor substrate is a crystalline substrate that may be formed using a bulk silicon or a silicon-on-insulator substructure. In other implementations, the semiconductor substrate may be formed using alternate materials, which may or may not be combined with silicon, that include but are not limited to germanium, silicon germanium, indium antimonide, lead telluride, indium arsenide, indium phosphide, gallium arsenide, gallium antimonide, or other semiconductor or III-V materials. In some implementations of the invention, the substrate 102 may be partially or completely formed of graphene, carbon nanotubes, amorphous carbon, or other carbon-based materials. Although a few examples of materials from which the substrate may be formed are described here, any material that may serve as a foundation upon which a semiconductor device may be built falls within the spirit and scope of the present invention.

The transistor 100 includes a gate dielectric stack 104. In accordance with one implementation of the invention, shown in FIG. 2A, the gate dielectric stack 104 includes a high-k gate dielectric layer 104A and a phonon-decoupling layer 104B. The portion of the substrate 102 directly beneath the gate dielectric stack 104 serves as a channel region 112 for the transistor 100.

The thickness of the phonon-decoupling layer 104B relative to the thickness of the high-k gate dielectric layer 104A can vary greatly. For example, in one implementation of the invention, the phonon-decoupling layer 104B may only be a few monolayers thick. In another implementation of the invention, the phonon-decoupling layer 104B may comprise the entire gate dielectric stack 104, as shown in FIG. 2B. The phonon-decoupling layer 104B may range anywhere between a few monolayers thick to the entire gate dielectric layer. In further implementations of the invention, the phonon-decoupling layer 104B may comprise any layer thicker than 5 nm to decouple high-k phonons from the substrate layer.

The high-k gate dielectric layer 104A may comprise a high-k material such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form high-k gate dielectric layer are described here, that layer may be made from other materials. In some embodiments, the high-k gate dielectric layer may be between around 5 Angstroms (Å) to around 50 Å thick. In further embodiments, additional processing may be performed on the high-k gate dielectric layer, such as an annealing process to improve the quality of the high-k material.

The high-k gate dielectric layer 104A may be formed using a conventional atomic layer deposition (ALD) process. In such a process, a metal oxide precursor (e.g., a metal chloride) and steam may be fed at selected flow rates into a reactor, which is then operated at a selected temperature and pressure to generate the high-k gate dielectric layer 104A. The reactor should be operated long enough to form a layer with the desired thickness.

In accordance with implementations of the invention, the phonon-decoupling layer 104B is formed between the substrate 102 and the high-k gate dielectric layer 104A. The phonon-decoupling layer 104B consists of a material that can form stable interfaces with both with the high-k gate dielectric material and the substrate material. In addition to forming stable interfaces, the phonon-decoupling layer 104B may substantially reduce or eliminate the formation of a silicon dioxide interfacial layer that typically forms between the substrate 102 and the high-k gate dielectric layer 104A. For instance, in one implementation the phonon-decoupling layer 104B lacks an oxygen source, which precludes a silicon dioxide interfacial layer from forming since there is no oxygen provided to react with silicon in the semiconductor substrate 102. By eliminating the silicon dioxide interfacial layer, the phonon-decoupling layer 104B reduces the adverse effect that the dielectric constant of the silicon dioxide has on the effective dielectric constant of the gate dielectric stack 104.

Furthermore, in accordance with implementations of the invention, the phonon-decoupling layer 104B has a dielectric constant that falls between 5.4 and 9.1. This is an intermediate range dielectric constant and has a much less adverse impact on the effective dielectric constant of the gate dielectric stack 104 than a silicon dioxide interfacial layer. Thus, by replacing the conventional silicon dioxide interfacial layer with the phonon-decoupling later 104B, the end result is a gate dielectric stack 104 having a higher effective dielectric constant relative to conventional dielectric gate stacks.

The phonon-decoupling layer 104B also has a high hardness that reduces coupling between the field in the channel region 112 and phonons in the high-k gate dielectric layer 104A for lower interface scattering, especially in the region where the electron mobility is degraded. More specifically, the high hardness results in a low phonon density near the room temperature substrate phonon frequencies to shield the phonons in the high-k gate dielectric layer from impacting the silicon or substrate channel mobility. This decoupling property directly improves electron mobility in the channel region 112, thereby improving transistor performance and efficiency.

In addition to the properties outlined above, the phonon-decoupling layer 104B can have further properties that enable it to positively impact the overall transistor device 100. These properties include, but are not limited to, a phonon band structure that enables lower electronic and phonon coupling between the gate dielectric and the channel region for lower interface scattering with a phonon density of states significantly reduced versus bulk silicon below 15 THz, an electronic band gap above 4 eV, and a thermodynamic interface energy that enables the layer 104B to remain stable and in distinct contact with the material of the substrate 102.

In one implementation of the invention, the phonon-decoupling layer 104B comprises boron nitride. In another implementation of the invention, the phonon-decoupling layer 104B comprises diamond. Both boron nitride and diamond lack an oxygen source, which precludes a silicon dioxide interfacial layer from forming at the interface of the phonon-decoupling layer 104B and the channel region 112.

Similar to the high-k dielectric layer 104A, the phonon-decoupling layer 104B may be formed in the case of boron nitride using a conventional ALD process with $BCl_3$ and $NH_3$ precursors at a temperature around 500 K. Alternately a high-temperature (1500-1900° C.) CVD process has also been demonstrated with $B_2H_6$, $NH_3$, and Ar. For diamond, CVD processes may be employed using a low pressure (1-27 kPa) process and utilizing both carbon and hydrogen sources to drive carbon deposition in an sp3 phase.

The transistor 100 further includes a gate electrode 106 formed atop the gate dielectric stack 104. The gate electrode 106 may be formed of a metal layer, a polysilicon layer, or a sacrificial material. If the gate electrode 106 is formed of a sacrificial material, a replacement metal gate process may be carried out to replace the sacrificial material with a metal gate electrode material. In one implementation, the sacrificial gate electrode may be removed using conventional wet or dry etching processes. Such etching processes are well known in the art. A metal gate electrode may then be deposited to replace sacrificial gate electrode that was removed.

If the gate electrode 106 consists of a metal, the metal gate electrode may be deposited using conventional metal deposition processes such as ALD, CVD, PVD, electroless plating, or electroplating. A planarization process such as CMP may be used to remove excess deposited metal. The metal gate electrode 106 may be formed using any conductive material from which a metal gate electrode may be derived including pure metals, metal alloys, metal oxides, nitrides, oxynitrides, and carbides.

When the metal gate electrode 106 will serve as an N-type workfunction metal, the gate electrode 106 preferably has a workfunction that is between about 3.9 eV and about 4.2 eV. N-type materials that may be used to form the metal gate electrode 106 include, but are not limited to, hafnium, zirconium, titanium, tantalum, aluminum, and metal carbides that include these elements, i.e., titanium carbide, zirconium carbide, tantalum carbide, hafnium carbide and aluminum carbide.

When the metal gate electrode 106 will serve as a P-type workfunction metal, the gate electrode 106 preferable has a workfunction that is between about 4.9 eV and about 5.2 eV. P-type materials that may be used to form the metal gate electrode 106 include, but are not limited to, ruthenium, palladium, platinum, cobalt, nickel, and conductive metal oxides, e.g., ruthenium oxide.

The metal gate electrode 106 should be thick enough to ensure that any material formed on it will not significantly impact its workfunction. In some implementations of the invention, the metal gate electrode 106 is between about 5 Å and about 600 Å thick, and more preferably is between about 50 Å and about 450 Å thick. Although a few examples of materials that may be used to form the metal gate electrode 106 are described here, that layer may be made from many other materials.

FIGS. 2A and 2B illustrate the metal gate electrode 106 on the gate dielectric stack 104. The metal gate electrode 106 is formed of a P-type or an N-type workfunction metal. As shown in FIG. 2B, in some implementations, the metal gate electrode 106 may include at least two layers, one layer serving as a workfunction metal layer 106A and the second layer serving as a fill metal layer 106B.

The transistor 100 further includes spacers 108, source and drain regions 110, and an ILD layer 114. The spacers 108 may be formed adjacent to the gate dielectric stack 104 and gate electrode 106 by depositing a material, such as silicon nitride or silicon dioxide, on the substrate and then etching the material to form the pair of spacers.

The source and drain regions 110 are typically formed by one of two conventional processes. The first process is to implant dopants such as boron, arsenic, or phosphorous into the substrate and then activate those dopants through an annealing process. In the second process, the substrate 102 may be etched to form recesses adjacent to the gate dielectric stack 104. These recesses may then be filled with a silicon alloy using a selective epitaxial deposition process. In some implementations, the silicon alloy may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In some implementations, a CVD process may be used for the deposition.

In implementations of the invention, the silicon alloy material that is deposited in the source and drain region cavities has a lattice spacing that is different than the lattice spacing of the substrate material. The difference in lattice spacing induces a tensile or compressive stress in the channel region of the MOS transistor. As is known to those of skill in the art, deciding whether to induce a tensile stress or a compressive stress will depend on whether an NMOS or a PMOS transistor is being formed. For an NMOS transistor, the source and drain region cavities may be filled with carbon doped silicon. The carbon doped silicon may be epitaxially and selectively deposited. The carbon doped silicon may be further doped in situ with phosphorous. For a PMOS transistor, the source and drain region cavities may be filled with silicon germanium. The silicon germanium may be epitaxially deposited. The germanium concentration may range from 10 atomic % to 50 atomic %. The silicon germanium may be further doped in situ with boron.

In some implementations of the invention, the transistor 100 may further include a source tip region 110A and a drain tip region 110A. Such tip regions 110A are sometimes fabricated using implant and diffusion techniques. Alternately, the source and drain tip regions 110A may be formed when the source and drain regions 110 are formed. For instance, if an etching process is used to form recesses for the source and drain regions 110, the etching process may be extended to undercut the spacers 108 and the gate dielectric stack 104. These undercuts may be filled with the same material that is used to fill the source and drain regions 110. As stated above, this fill material is generally a silicon alloy such as silicon germanium or carbon-doped silicon.

Finally, a low-k dielectric material may be deposited and polished to form an interlayer dielectric (ILD) layer 114 over the device 100. Low-k dielectric materials that may be used for the ILD layer include, but are not limited to, silicon dioxide, carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layer may include pores or other voids to further reduce its dielectric constant.

In one implementation of the invention, a subtractive process may be used to form the gate dielectric stack 104 and the gate electrode 106. In a subtractive process, the layers that form the gate dielectric stack 104 may be blanket deposited onto the semiconductor substrate using conventional deposition processes such as chemical vapor deposition (CVD), atomic layer deposition (ALD), spin-on deposition (SOD), or physical vapor deposition (PVD). Next, a blanket layer of gate electrode material may be deposited on the gate dielectric layer using similar deposition techniques such as ALD, CVD, or PVD. In some implementations, the gate electrode material is polysilicon or a metal layer. In some implementations, the gate electrode material is a sacrificial material that can later be removed for a replacement metal gate process. A conventional patterning process may then be carried out to etch away portions of the gate electrode layer and the gate dielectric layer to form the gate dielectric stack 104 and the gate electrode 106.

Figure 3:
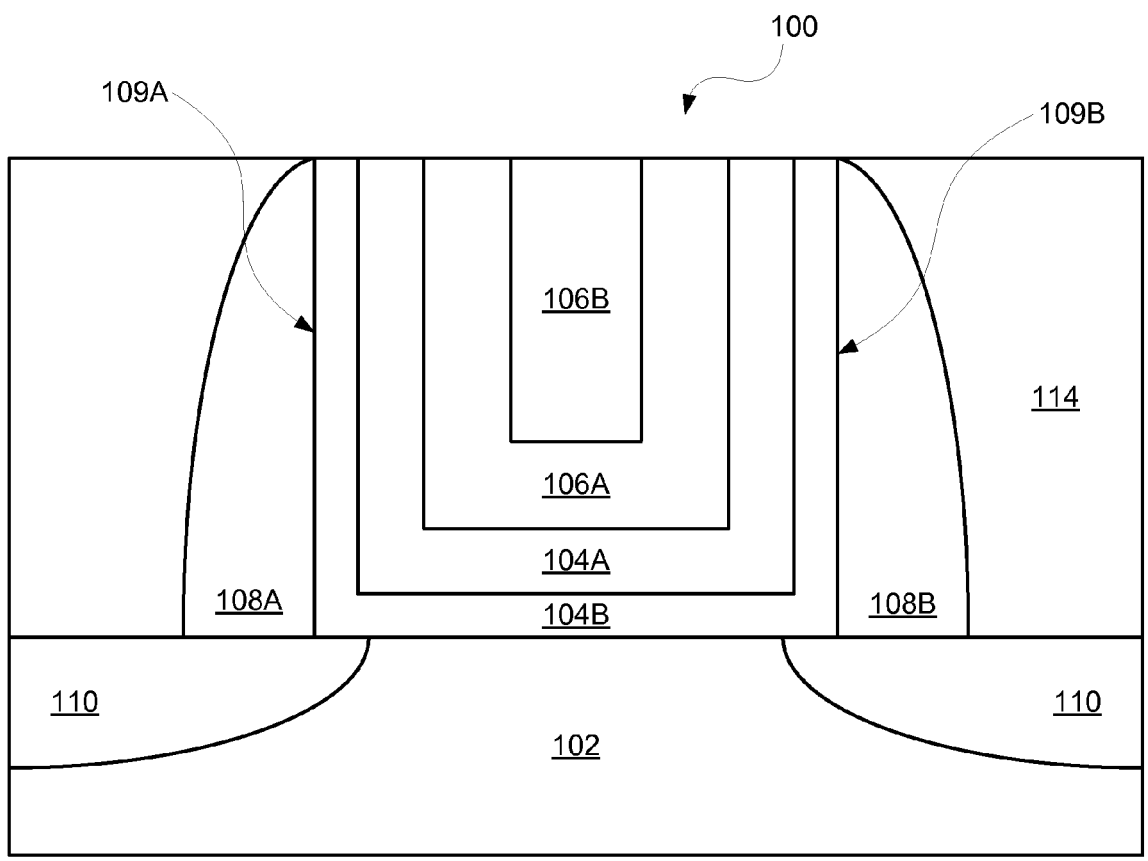
FIG. 3 illustrates an implementation of the invention where a phonon-decoupling layer is used in a replacement metal gate process.

FIG. 3 illustrates another implementation of the invention in which a replacement metal gate process may be used to form the gate dielectric stack 104 and the gate electrode 106. In a replacement metal gate process, a sacrificial gate electrode is initially deposited. After the transistor 100 has been formed, the sacrificial gate electrode is removed, thereby forming a trench between a first spacer 108A and a second spacer 108B. Methods of removing the sacrificial gate are well known in the art. The formation of the trench exposes three surfaces—a top surface of the substrate 102, a first sidewall 109A of the first spacer 108A, and a second sidewall 109B of the second spacer 108B. The top surface of the substrate 102 exposed at the bottom of the trench may be etched to remove any native oxide.

Next, the phonon-decoupling layer 104B is conformally deposited using an ALD or CVD process, followed by a conformal ALD or CVD deposition of the high-k gate dielectric layer 104A. The ALD/CVD deposition of both layers into the trench results in the phonon-decoupling layer 104B and the high-k gate dielectric layer 104A being deposited on both sidewalls 109A and 109B, as well as on the bottom of the trench atop the substrate 102, resulting in a "U" shaped gate dielectric stack as shown in FIG. 3. As shown, a U-shaped phonon-decoupling layer 104B is formed conformally on a top surface of the substrate 102, as well as on the first and second sidewalls 109A and 109B. Further, a U-shaped high-k gate dielectric layer 104A is formed conformally on the U-shaped phonon-decoupling layer 104B.

After the phonon-decoupling layer 104B and the high-k gate dielectric layer 104A are deposited, a metal gate electrode 106 is deposited into the trench atop the high-k gate dielectric layer 104A. The metal gate electrode 106 may consist of one or multiple layers, such as a workfunction metal layer 106A and a fill metal layer 106B. This is shown in FIG. 3 as well. A planarization process may also be used to remove excess metal sited atop the ILD layer.

Figure 4A:
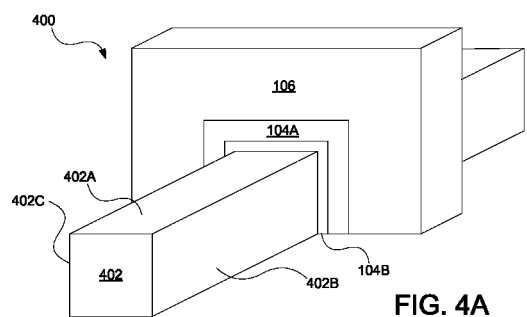
FIGS. 4A and 4B illustrate a phonon-decoupling layer used in the gate dielectric stack for a nonplanar transistor.

FIG. 4A illustrates another implementation of the invention in which the gate dielectric stack 104 consisting of the phonon-decoupling layer 104B and the high-k gate dielectric layer 104A may be formed on a nonplanar transistor body. The nonplanar transistor, in this case a trigate transistor 400, includes a semiconductor body 402 formed on a substrate (not shown). The semiconductor body 402 has at least three surfaces, a top surface 402A and two sidewall surfaces 402B and 402C. The phonon-decoupling layer 104B is formed on the top surface 402A and adjacent to the two sidewalls 402B/C of the semiconductor body 402. The high-k gate dielectric layer 104A is formed on the phonon-decoupling layer 104B. The high-k gate dielectric layer 104A is therefore formed over the top surface 402A and adjacent to the two sidewalls 402B/C of the semiconductor body 402, and is only separated from the semiconductor body 402 by the phonon-decoupling layer 104B.

Figure 4B:
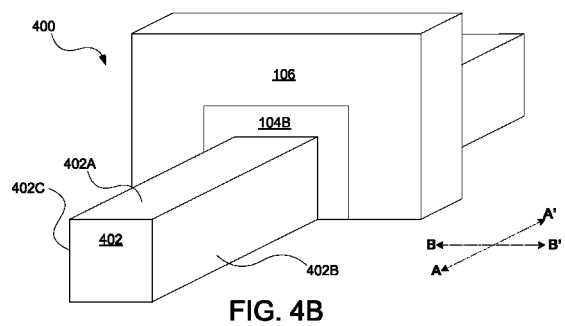

A gate electrode 106 is formed on the high-k gate dielectric layer 104A. The gate electrode 106 may be formed of a metal or polysilicon. Since the gate electrode 106 is formed over a top surface and adjacent to two sidewalls of the semiconductor body 402, there are three gates formed. A first gate is formed proximate the top surface 402A, a second gate is formed proximate the sidewall surface 402B, and a third gate is formed proximate the sidewall surface 402C. In another implementation, the phonon-decoupling layer 104B may form the entire gate dielectric layer, as shown in FIG. 4B.

A source region (not shown) and a drain region (not shown) may be formed in the semiconductor body on opposite sides of the gate electrode, as is well known in the art. Furthermore, a pair of spacers (not shown) may be formed on opposing sides of the gate electrode that run substantially perpendicular to the semiconductor body.

Figure 5A:
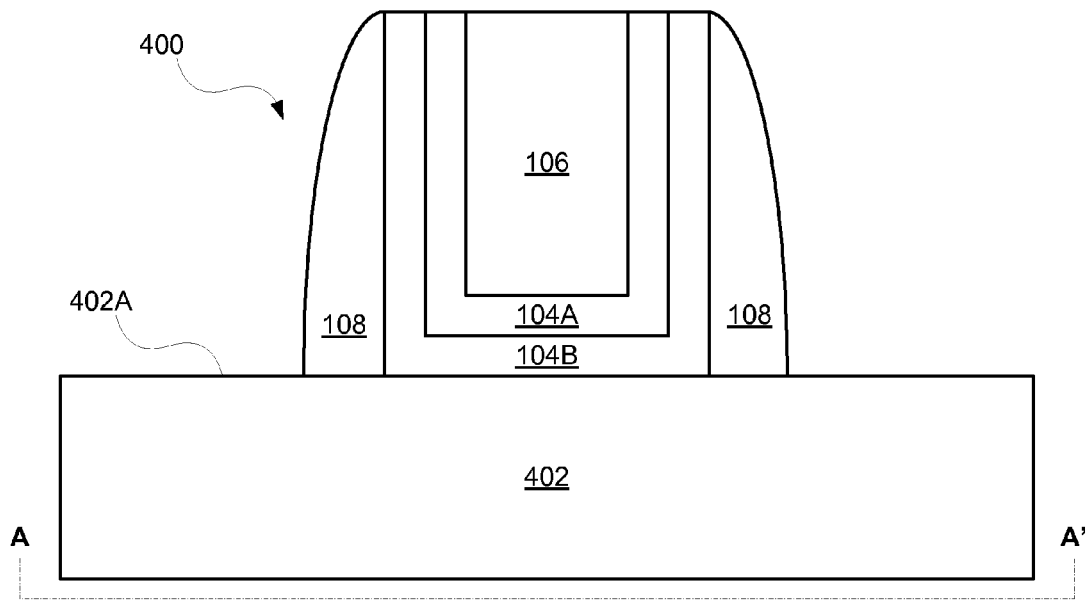
FIGS. 5A and 5B are cross-sectional diagrams of a nonplanar transistor that includes a phonon-decoupling layer.
Figure 5B:
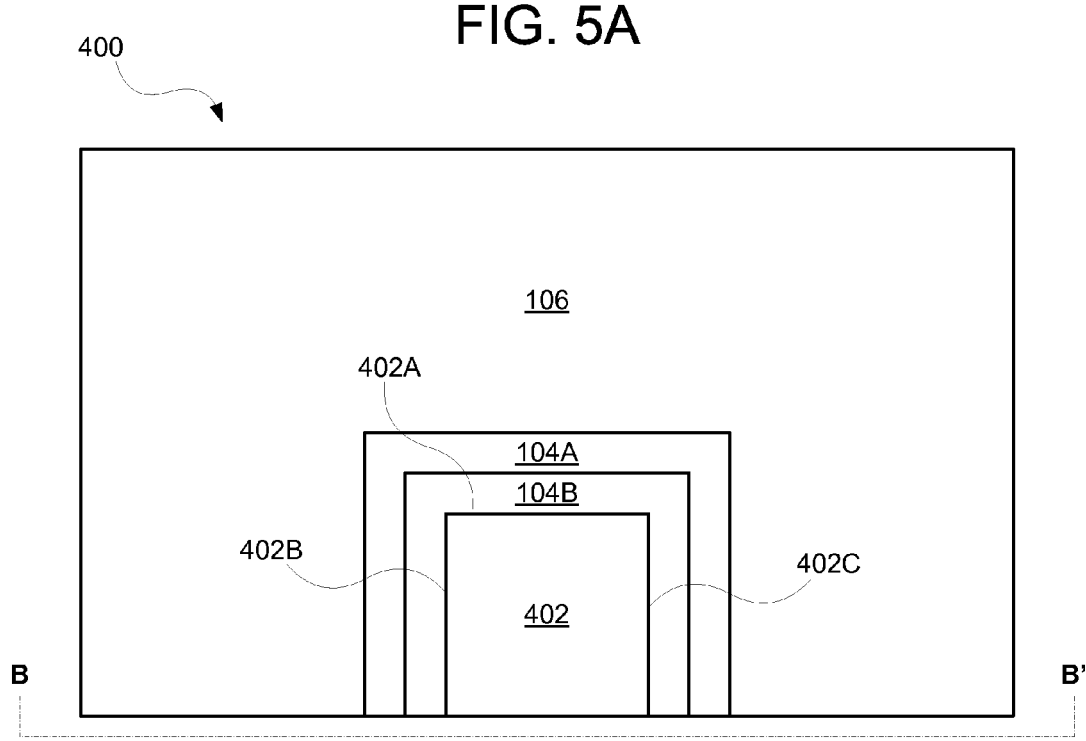

In yet another implementation of the invention, the gate dielectric stack 104 may be formed during a replacement metal gate process carried out on the nonplanar transistor 400. In such a process, the gate dielectric stack 104 will be deposited on the sidewalls of spacers 108 formed on the semiconductor body 402 as well as on the top surface and sidewall surfaces of the semiconductor body 402. FIGS. 5A and 5B illustrate two cross-section illustrations of a transistor 400 that is formed by a replacement metal gate process. FIG. 5A is a cross-section taken along plane A-A' shown in FIG. 4B, which is along the length of the semiconductor body 402. FIG. 5B is a cross-section taken along plane B-B' shown in FIG. 4B, which is along the length of the gate electrode 106.

FIG. 5A, which is the cross-section taken along the length of the semiconductor body 402, shows the spacers 108. As shown, the phonon-decoupling layer 104B is deposited along the sidewalls of the spacers 108 as well as on the top surface 402A of the semiconductor body 402. FIG. 5B, which is the cross-section taken along the length of the gate electrode 106, shows the phonon-decoupling layer 104B, the high-k gate dielectric layer 104A, and the gate electrode 106, all formed adjacent to three separate surfaces of the semiconductor body 402 (i.e., surfaces 402A, 402B, and 402C). This configuration forms three separate gates, thereby forming a trigate transistor 400.

Thus the above implementations provide a gate dielectric stack that consists of a high-k gate dielectric layer and a phonon-decoupling layer that can reduce coupling between the field in the channel region and phonons in the high-k dielectric layer. The phonon-decoupling layer can also produce a stable interface between the substrate and the high-k gate dielectric layer, can eliminate the presence of a silicon dioxide interfacial layer, and increase the effective dielectric constant of the transistor stack.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
   a substrate;
   a phonon-decoupling layer disposed directly on the substrate, wherein the phonon-decoupling layer comprises a material that lacks an oxygen source, that has a dielectric constant between 5.4 and 9.1, that has a phonon density of states significantly reduced versuses bulk silicon below 15 THz, and that has an electronic band gap above 4eV;
   a gate dielectric layer formed on the phonon-decoupling layer;
   a gate electrode formed on the gate dielectric layer;
   a pair of spacers formed on opposite sides of the gate electrode;
   a source region formed in the substrate subjacent to the phonon-decoupling layer; and
   a drain region formed in the substrate subjacent to the phonon-decoupling layer wherein said source region and said drain region are on opposite sides of said gate electrode.

2. The apparatus of claim 1, wherein the substrate is selected from the group consisting of silicon, germanium, silicon germanium, indium antimonide, lead telluride, indium arsenide, indium phosphide, gallium arsenide, gallium antimonide, graphene, carbon nanotubes, and amorphous carbon.

3. The apparatus of claim 1, wherein the phonon-decoupling layer comprises boron nitride.

4. The apparatus of claim 1, wherein the phonon-decoupling layer comprises diamond.

5. The apparatus of claim 1, wherein the gate dielectric is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

6. The apparatus of claim 1, wherein the gate electrode comprises a workfunction metal and a fill metal.

7. An apparatus comprising:
   a substrate;
   a first spacer and a second spacer formed on the substrate, the first spacer having a first sidewall and the second spacer having a second sidewall;
   a U-shaped phonon-decoupling layer formed conformally on a top surface of the substrate, as well as on the first and second sidewalls wherein the U-shaped phonon-decoupling layer comprises a material that lacks an oxygen source, that has a dielectric constant falling between 5.4 and 9.1, that has a phonon density of states significantly reduced versus bulk silicon below 15 THz, and that has an electronic band gap above 4 eV;

a U-shaped high-k gate dielectric layer formed conformally on the U-shaped phonon-decoupling layer;

a gate electrode formed on the U-shaped high-k gate dielectric layer;

a source region formed in the substrate subjacent to the first spacer; and a drain region formed in the substrate subjacent to the second spacer.

8. The apparatus of claim 7, wherein the U-shaped phonon-decoupling layer comprises boron nitride.

9. The apparatus of claim 7, wherein the U-shaped phonon-decoupling layer comprises diamond.

10. The apparatus of claim 7, wherein the U-shaped high-k gate dielectric layer is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

11. The apparatus of claim 7, wherein the substrate is selected from the group consisting of silicon, germanium, silicon germanium, indium antimonide, lead telluride, indium arsenide, indium phosphide, gallium arsenide, gallium antimonide, graphene, carbon nanotubes, and amorphous carbon.

12. An apparatus comprising:
   a semiconductor body having a top surface, a first sidewall surface, and a second sidewall surface;
   a phonon-decoupling layer disposed directly on the semiconductor body, wherein a first portion of the phonon-decoupling layer is disposed directly on the top surface of the semiconductor body, a second portion of the phonon-decoupling layer is disposed directly on the first sidewall surface of the semiconductor body, and a third portion of the phonon-decoupling layer is disposed directly on the second sidewall surface of the semiconductor body;
   a high-k gate dielectric layer formed on the phonon-decoupling layer, wherein a first portion of the high-k gate dielectric layer is formed on the first portion of the phonon-decoupling layer, a second portion of the high-k gate dielectric layer is formed adjacent to the second portion of the phonon-decoupling layer, and a third portion of the high-k gate dielectric layer is formed adjacent to the third portion of the phonon-decoupling layer; and
   a gate electrode formed on the high-k gate dielectric layer, wherein a first portion of the gate electrode is formed on the first portion of the high-k gate dielectric layer forming a first gate, a second portion of the gate electrode is formed adjacent to the second portion of the high-k gate dielectric layer forming a second gate, and a third portion of the gate electrode is formed adjacent to the third portion of the high-k gate dielectric layer forming a third gate.

13. The apparatus of claim 12, wherein the semiconductor body further comprises a source region and a drain region formed on opposite sides of the gate electrode.

14. The apparatus of claim 12, wherein the phonon-decoupling layer comprises boron nitride.

15. The apparatus of claim 12, wherein the phonon-decoupling layer comprises diamond.

16. The apparatus of claim 12, wherein the phonon-decoupling layer comprises a material lacking an oxygen source and having a dielectric constant between 5.4 and 9.1.

17. The apparatus of claim 12, wherein the high-k gate dielectric layer comprises a material selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

18. The apparatus of claim 12, wherein the gate electrode comprises a material selected from the group consisting of hafnium, zirconium, titanium, tantalum, aluminum, titanium carbide, zirconium carbide, tantalum carbide, hafnium carbide, aluminum carbide, ruthenium, palladium, platinum, cobalt, nickel, and ruthenium oxide.

19. The apparatus of claim 12, wherein the gate electrode comprises a workfunction metal and a fill metal.

* * * * *